United States Patent
Buono

(10) Patent No.: US 10,014,831 B1
(45) Date of Patent: Jul. 3, 2018

(54) AUDIO AMPLIFIER POWER SUPPLY RAIL-BALANCING AND ANTI-PUMPING SYSTEM

(71) Applicant: Crestron Electronics, Inc., Rockleigh, NJ (US)

(72) Inventor: Robert Buono, Ringwood, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 15/440,704

(22) Filed: Feb. 23, 2017

(51) Int. Cl.
*H03F 1/52* (2006.01)
*H03F 3/185* (2006.01)
*H03F 3/21* (2006.01)
*H03F 3/217* (2006.01)

(52) U.S. Cl.
CPC .......... *H03F 1/523* (2013.01); *H03F 3/185* (2013.01); *H03F 3/2171* (2013.01); *H03F 2200/03* (2013.01); *H03F 2200/534* (2013.01)

(58) Field of Classification Search
USPC ............... 330/10, 251, 207 A, 296–297
See application file for complete search history.

(56) References Cited

U.S. PATENT DOCUMENTS 6,169,681 B1 * 1/2001 Kemp, III ............. H02M 3/337
363/134

* cited by examiner

*Primary Examiner* — Hieu Nguyen
(74) *Attorney, Agent, or Firm* — Crestron Electronics, Inc

(57) ABSTRACT

A rail balancing circuit is described herein for use with a power supply, the RBC comprising: a circuit adapted to respond to over-voltage and under-voltage conditions in the power supply that comprises a positive rail voltage source and a negative rail voltage source, such that any deviation from a balanced condition between the positive rail voltage source and the negative rail voltage source is substantially instantaneously corrected to bring both the positive and negative rail voltage sources back to the balanced condition.

24 Claims, 6 Drawing Sheets

100

300

AUDIO AMPLIFIER POWER SUPPLY RAIL-BALANCING AND ANTI-PUMPING SYSTEM

BACKGROUND

Technical Field

Aspects of the embodiments relate to digital amplifiers and more particularly to systems, methods, and modes for mitigating over-voltage situations in Class-D amplifiers.

Background Art

A Class-D amplifier is an electronic amplifier in which transistors operate as electronic switches that rapidly alternate between conductive and nonconductive states. The analog signal to be amplified is converted to a stream of pulses. Pulse conversion can be accomplished using pulse width modulation, pulse density modulation, or by another method. After amplification, the output pulse stream is converted back to an analog signal by passing it through a passive low pass filter. Passive low pass filters are commonly comprised of inductors and capacitors. One advantage of Class-D amplifiers is that they are typically more efficient than analog amplifiers because less power is dissipated as heat.

However, problems arise with Class-D amplifiers that comprise a half-bridge circuit topology and a positive and a negative power supply rail. For example, over-voltage induced on one of the power supply rails can damage components if the rated voltage limits for those components are exceeded. Over-voltage is common as an operating characteristic of Class-D amplifiers that use a half-bridge circuit topology and a positive and negative power supply rail.

The half-bridge circuit topology allows energy drawn from one of the two power supply rails to be dumped into the opposite polarity power supply rail. When this occurs, the rail to which energy is pumped will increase in voltage, and, if the energy into that rail exceeds the energy drawn from that rail, the rail voltage will continue to increase causing an over-voltage condition. The problem is exacerbated by higher output power levels, and lower audio output frequencies.

Others have attempted solutions to these problems. For example, increasing the capacitance of the rail capacitors. This modification adds more components, cost, uses valuable physical space, and adds weight. Another example is to utilize a full-bridge circuit topology for the amplifier instead of half-bridge. This latter modification also suffers from increased parts count, as well as other negative factors.

Accordingly, a need has arisen for systems, methods, and modes for mitigating over-voltage situations in Class-D amplifiers.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for mitigating over-voltage situations in Class-D amplifiers that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a rail balancing circuit (RBC) is provided comprising a simple two-winding transformer, operating at a fixed switching frequency, and four metal oxide semiconductor field effect transistor (MOSFET) switches, operating as synchronous rectifiers. The RBC alternately impresses one, and then the other output voltage across one of the two transformer windings. Current can then flow through the other (matched) transformer winding, in such a direction as to force a balancing of the output voltage of the opposite polarity. Since the RBC operates substantially continuously and at high switching frequency (greater than about 100 kHz) the amount of voltage correction that needs to be made during any one single switching cycle (e.g., about 10 μsec at about 100 kHz switching frequency) is small, so corrective currents do not need to be large instantaneous surge currents, but rather currents that increase, crest, and decay synchronously with the audio signal and audio power demand.

According to further aspects of the embodiment, the RBC can be used in a Class-D amplifier that is smaller in size, and lower in cost. In addition, the value and physical size of the capacitors used in the RBC according to aspect of the embodiments can be made smaller, lighter and less expensive than they would be otherwise in an half-bridge Class D audio amplifier that does not use the RBC according to aspects of the embodiments.

According to further aspects of the embodiments, power can be drawn from both rail caps, substantially simultaneously, independent of the polarity of the audio output signal.

According to a first aspect of the embodiments, a rail balancing circuit (RBC) for use with a power supply is provided, the RBC comprising: a circuit adapted to respond to over-voltage and under-voltage conditions in the power supply that comprises a positive rail voltage source and a negative rail voltage source, such that any deviation from a balanced condition between the positive rail voltage source and the negative rail voltage source is substantially instantaneously corrected to bring both the positive and negative rail voltage sources back to the balanced condition.

According to the first aspect of the embodiments, the circuit is further adapted to respond, when in a first circuit state condition, to apply a positive rail voltage to a first input of a first transformer and a negative rail voltage to a second input of the first transformer.

According to the first aspect of the embodiments, the RBC further comprises a first transistor based circuit arrangement adapted to operate as a first power supply voltage balancer for both the positive and negative rail voltage sources when the positive rail voltage source is in either an over-voltage or under-voltage condition and the negative rail voltage source is in either an under-voltage or over-voltage condition.

According to the first aspect of the embodiments, the first circuit state condition comprises: the first transistor based circuit arrangement is in an on condition such that first transistor based circuit arrangement is substantially electrically equivalent to an electrical short, so that current can flow through the first transistor based circuit arrangement in a substantially unimpeded manner with substantially no voltage drop across the first transistor based circuit arrangement.

According to the first aspect of the embodiments, the circuit, when in the first circuit condition, and experiencing a positive rail voltage over-voltage situation, allows the positive rail voltage source to supply additional current to the negative rail voltage source through the first transistor based circuit arrangement and the first transformer such that a balanced condition is substantially instantaneously achieved.

According to the first aspect of the embodiments, the first circuit state condition further comprises: a second transistor based circuit arrangement in an off condition such that each of the transistors is substantially electrically equivalent to an electrical open, so that current cannot flow through either of them.

According to the first aspect of the embodiments, the first transistor based circuit arrangement comprises: a first n-channel transistor (first transistor), a drain connection of which is connected to the positive rail voltage source, a source connection of which is connected to the first input of the first transformer, and a gate connection of which is connected to a switching on-off drive signal (switching drive signal), the switching drive signal turning the first transistor periodically on and off; and a second n-channel transistor (second transistor), a source connection of which is connected to the negative rail voltage source, a drain connection of which is connected to the second input of the first transformer, and a gate connection of which is connected to the switching drive signal to be periodically turned on and off substantially simultaneously with the first transistor.

According to the first aspect of the embodiments, the circuit is further adapted to respond, when in a second circuit state condition, to apply the positive rail voltage to the second input of the first transformer and the negative rail voltage to the first input of the first transformer.

According to the first aspect of the embodiments, the RBC further comprises: a second transistor based circuit arrangement adapted to operate as a second power supply voltage balancer for both the positive and negative rail voltage sources when the positive rail voltage source is in either an under-voltage or over-voltage condition and the negative rail voltage source is in either an under-voltage or over-voltage condition.

According to the first aspect of the embodiments, the second circuit state condition comprises: the second transistor based circuit arrangement is in an on condition such that the second transistor based circuit arrangement is substantially electrically equivalent to an electrical short, so that current can flow through the second transistor based circuit arrangement in a substantially unimpeded manner with substantially no voltage drop across the second transistor based circuit arrangement.

According to the first aspect of the embodiments, the circuit, when in the second circuit condition, and experiencing a negative rail voltage over-voltage situation, allows the negative rail voltage source to supply additional current to the positive rail voltage source through the second transistor based circuit arrangement and the first transformer such that a balanced condition is substantially instantaneously achieved.

According to the first aspect of the embodiments, the second circuit state condition further comprises: a second transistor based circuit arrangement in an off condition such that the second transistor based circuit arrangement is substantially electrically equivalent to an electrical open, so that current cannot flow through the second transistor based circuit arrangement.

According to the first aspect of the embodiments, the second transistor based circuit arrangement comprises: a third n-channel transistor (third transistor), a source connection of which is connected to the negative rail voltage source, a drain connection of which is connected to the first input of the first transformer, and a gate connection of which is connected to a switching on-off drive signal (switching drive signal), the switching drive signal turning the third transistor periodically on and off; and a fourth n-channel transistor (fourth transistor), a drain connection of which is connected to the positive rail voltage source, a source connection of which is connected to the second input of the first transformer, and a gate connection of which is connected to the switching drive signal to be periodically turned on and off substantially simultaneously with the third transistor.

According to the first aspect of the embodiments, the RBC further comprises: a first pair of transistors adapted to balance the positive and negative rail voltage sources when an over-voltage condition exists on the positive rail voltage source and an under-voltage condition occurs on the negative rail voltage source; a second pair of transistors adapted to balance the positive and negative rail voltage sources when an over-voltage condition exists on the negative rail voltage source and an under-voltage condition occurs on the positive rail voltage source; a timing circuit adapted to alternatively turn on and off the first and second pair of transistors, such that when the first pair of transistors is on, the second pair of transistors is off, and when the second pair of transistors is on, the first pair of transistors is off; and an over-current circuit adapted to turn off both the first pair and second pair of transistors when an over-current condition exists through the first transformer.

According to a second aspect of the embodiments, a method for operating a rail balancing circuit (RBC) for use in maintaining a balanced condition in a power supply with equal but opposite polarity outputs is provided, the method comprising: substantially continuously switching a positive rail voltage source and a negative rail voltage source; and when the positive rail voltage source has experienced an over-voltage condition and the negative rail voltage source has experienced an under-voltage condition, turning on a first pair of transistors adapted to balance the positive and negative rail voltage sources when the over-voltage condition exists on the positive rail voltage source and the under-voltage condition occurs on the negative rail voltage source, and when the negative rail voltage source has experienced an over-voltage condition and the positive rail voltage source has experienced an under-voltage condition, turning on a second pair of transistors adapted to balance the positive and negative rail voltage sources when the over-voltage condition exists on the negative rail voltage source and the under-voltage condition occurs on the positive rail voltage source.

According to the second aspect of the embodiments, the step of turning on a first pair of transistors comprises:

applying a positive rail voltage to a first input of a first transformer and a negative rail voltage to a second input of the first transformer.

According to the second aspect of the embodiments, the step of turning on a first pair of transistors comprises: operating the first pair of transistors as a first power supply voltage balancer for both the positive and negative rail voltage sources when the positive rail voltage source is in the over-voltage condition and the negative rail voltage source is in the under-voltage condition.

According to the second aspect of the embodiments, the first pair of transistors are in an on condition such that each of the transistors is substantially electrically equivalent to an electrical short, so that current can flow through each of them in a substantially unimpeded manner with substantially no voltage drop across the transistor.

According to the second aspect of the embodiments, the method further comprises: the positive rail voltage source supplying additional current to the negative rail voltage source through the first and second transistors and the first transformer such that a balanced condition is substantially instantaneously achieved.

According to the second aspect of the embodiments, the method further comprises: a second pair of transistors being in an off condition such that each of the transistors is substantially electrically equivalent to an electrical open, so that current cannot flow through either of them.

According to the second aspect of the embodiments, the step of turning on the second pair of transistors comprises: applying the positive rail voltage to the second input of the first transformer and the negative rail voltage to the first input of the first transformer.

According to the second aspect of the embodiments, the step of turning on the second pair of transistors comprises: operating the second pair of transistors as a second power supply voltage balancer for both the positive and negative rail voltage sources when the positive rail voltage source is in the under-voltage condition and the negative rail voltage source is in the over-voltage condition.

According to the second aspect of the embodiments, the second pair of transistors are in an on condition such that each of the transistors is substantially electrically equivalent to an electrical short, so that current can flow through each of them in a substantially unimpeded manner with substantially no voltage drop across the transistor.

According to the second aspect of the embodiments, the method further comprises: the negative rail voltage source supplying additional current to the positive rail voltage source through the third and fourth transistors and the first transformer such that a balanced condition is substantially instantaneously achieved.

According to the second aspect of the embodiments, the method further comprises: a first pair of transistors being in an off condition such that each of the transistors is substantially electrically equivalent to an electrical open, so that current cannot flow through either of them.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
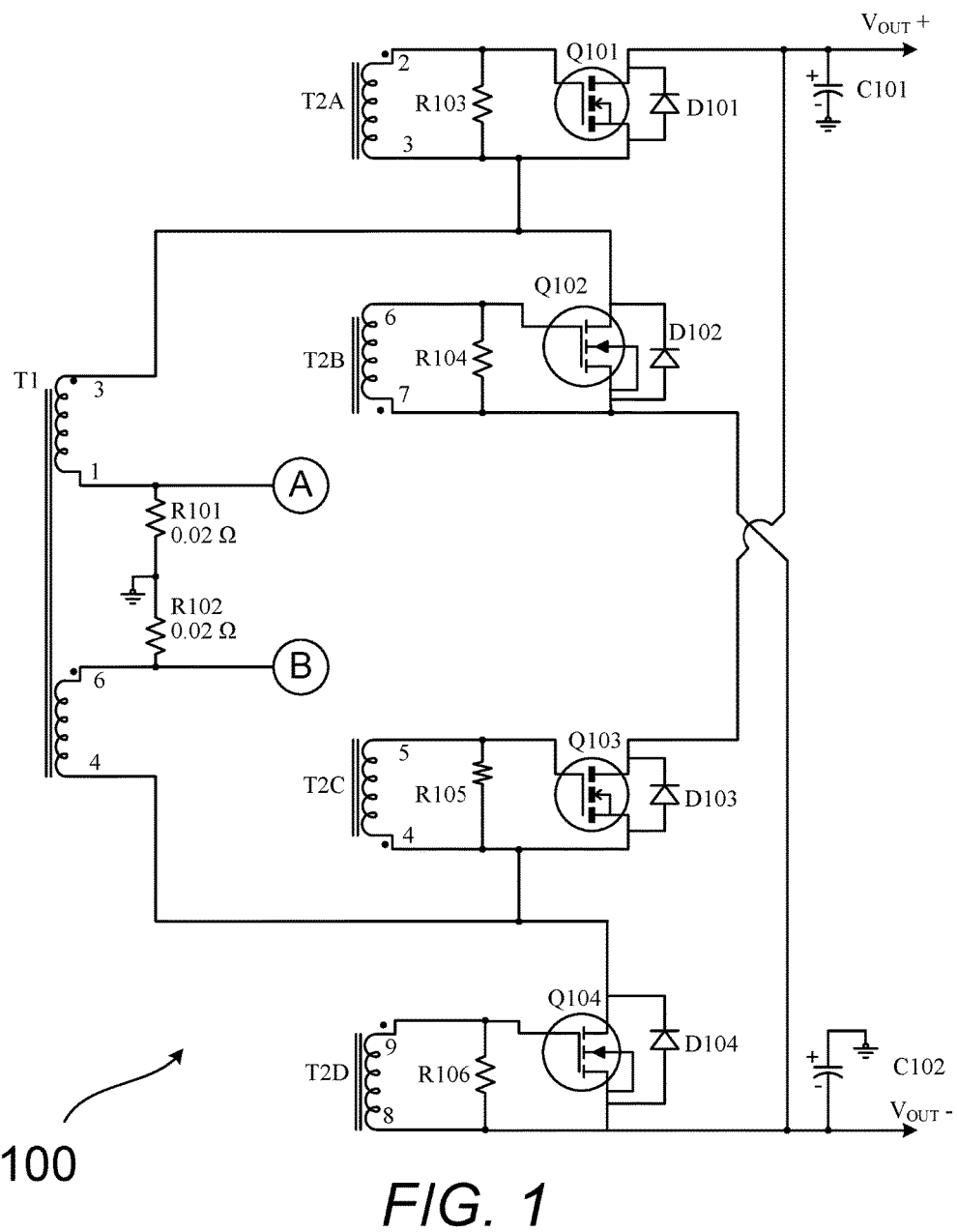
FIG. 1 illustrates a schematic of a rail balancing circuit according to aspects of the embodiments.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as media presentation products, which include audio Class-D amplifiers.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
    100 Rail Balancing Circuit (RBC)
    C101-102 Capacitors 101-102 of RBC
    D101-104 Diodes 101-104 of RBC, which are incorporated in Q101-Q104, respectively
    Q101-104 Transistors 101-104 of RBC
    R101-106 Resistors 101-106 of RBC
    T1 First Transformer T2 Second Transformer
200 Drive Signal Circuit (DSC)
U201 Voltage Mode Controller Integrated Circuit
C201-204 Capacitors 201-204 of DSC
D201-204 Diodes 201-204 of DSC
R201-204 Resistors 201-204 of DSC
300 High Speed Voltage Comparator Circuit (HSVCC)
U301a,b Dual High Speed Voltage Comparator Integrated Circuit
U302 5 Volt Zener Diode Circuit
C301-304 Capacitors 301-304 of HSVCC
D301-302 Diodes 301-302 of HSVCC
R301-305 Resistors 301-305 of HSVCC

LIST OF ACRONYMS USED IN THE SPECIFICATION IN ALPHABETICAL ORDER

The following is a list of the acronyms used in the specification in alphabetical order.
C Capacitor
D Diode
DC Direct Current
DSC Drive Signal Circuit
HSVCC High Speed Voltage Comparator Circuit
MOSFET Metal Oxide Semiconductor Field Effect Transistor
PD Polarity Dot
Q Transistor
R Resistor
RBC Rail Balancing Circuit
Tn Transformer [number "n"]
V Volt(s)
W Watt(s)

LIST OF VALUES OF SEVERAL OF THE COMPONENTS ACCORDING TO ASPECTS OF THE EMBODIMENTS

The following is a list of values for several of the discrete components shown in the drawings.
Ref-Des. Description
T1 Transformer; PQ2625, un-gapped, PC44
T2 Transformer; Pulse Engineering P0585 Gate Drive Transformer
U201 Texas Instruments; LM5033 Voltage Mode Controller
U301 ST Microelectronics; TS3022; Dual-Micro power FAST Comparator
U302 Zener, 5.1V, On Semiconductor, MMSZ5231B
Q101-Q104 International Rectifier; IRFB4615; TO-220
D201-D204 Schottky, 1 amp (A), 40 volts (V), SOD-123
D301, D302 1N4148, SOD-123
C201, C202 1 micro-farad (µF), 35V, X7R, 0805
C203, C301, C303 1 µF, 35V, X7R, 0805
C203, C302, C304 220 pico-farad (pF), COG, 50V, 5%, 0603
C101, C102 800 µF, 80V, AE, UCC, IKY-800ELL801MM25S
R204 23.7 kilo-ohm (K), 1%, 0603
R304 4.75K, 1%, 0603
R202, R203 1K, 1%, 0603
R301, R302 1K, 1%, 0603
R305 200 ohm (Ω), 1%, 0603
R101, R102 0.02Ω, 1%, 2512, 2 W
R201, R103-R106 10K, 1%, 0603

The different aspects of the embodiments described herein pertain to the context of an audio amplifier circuit, but is not limited thereto, except as may be set forth expressly in the appended claims.

For 40 years Crestron Electronics Inc., has been the world's leading manufacturer of advanced control and automation systems, innovating technology to simplify and enhance modern lifestyles and businesses. Crestron designs, manufactures, and offers for sale, integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein, as embodied as rail balancing circuit (RBC) 100 can be manufactured by Crestron Electronics Inc., located in Rockleigh, N.J.

Aspects of the embodiments are described herein in the context of a 200 watt (W) Class-D audio amplifier, but is not limited thereto, except as may be set forth expressly in the appended claims. For example, while a 200 W Class-D audio amplifier is used as an example of an implementation of the embodiments, those of skill in the art can readily appreciate that the specified power rating can be something other than 200 W, e.g., 100 W, 500 W, among virtually limitless other power ratings. Thus, the embodiments can be easily "scaled" by those skilled in the art to suit it for lower or higher power amplifiers at optimal price-points for those different power levels.

Figure 4:
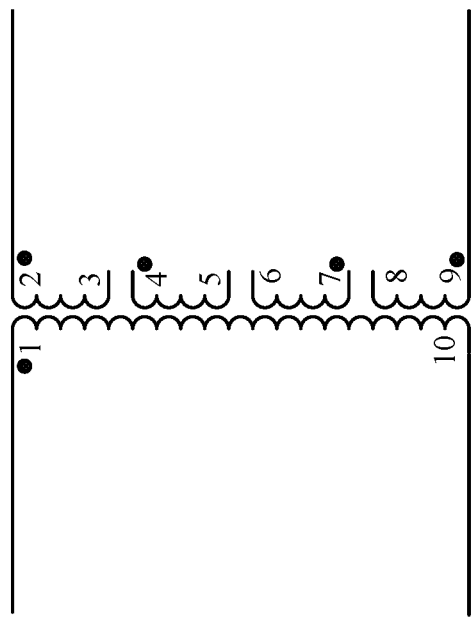
FIG. 4 illustrates a schematic of the transformer configuration used to drive the transistors in the rail balancing circuit of FIG. 1 according to aspects of the embodiments.

Rail balancing circuit (RBC) 100, as shown in FIG. 1, comprises resistors R101-R106, diodes D101-D104, capacitors C101-C102, transformers T1 and T2, and metal-oxide-semiconductor field-effect transistors (MOSFET; Q) Q101-Q104 (D101-104 can be separate components, or, as those of skill in the art can appreciate, they can be integrated into their respective MOSFET transistor package). As those of skill in the art can appreciate, however, other types of transistor technology can be used in implementing RBC 100, which may necessitate different values of certain components, but which do not substantively change the theory of operation of RBC 100 according to aspects of the embodiments. Transistors Q101-104 are driven on and off by gate-drive transformer T2, which is configured as shown in FIG. 4, as a plurality of secondary outputs T2A-T2D. According to further aspects of the embodiments, the drive signal delivered by transformer T2, as a result of the signal generated by DSC 200 (shown in FIG. 2) has a fixed duty-cycle of about 50%. According to aspects of the embodiments, transformer T1 can be referred to as a voltage matching transformer, while transformer T2 can be referred to as a transistor driving transformer.

Each of the transformers shown in FIG. 1 (and FIG. 2) includes one or more polarity dots (PD), located at a particular pin of the transformer. As those of skill in the art can appreciate, transformer T2 includes four separate secondary windings, denoted by pairs of pins 2-3, 7-6, 5-4, and 8-9, while transformer T1 includes pins 3-1, and 6-4. In transformer T2 there are PDs located at pins 1, 2, 7, 4, and 9, while at transformer T1 there are PDs at pins 3 and 6. As those of skill in the art can appreciate, the PDs on transformers T1 and T2 indicate the phase of the windings. For example, PD 2 of transformer T2A and PD 9 of transformer T2D indicate that these winding are in-phase, while PD 4 of transformer T2C and PD 7 of transformer T2B indicates that these windings have an inverted phase (180° out-of-phase)

with reference to the windings of transformers T2A and T2D, and PDs 2, and 9 (respectively).

According to aspects of the embodiments, this phasing causes transistors Q101 and Q104 to be driven on and off at the same time, while transistors Q102 and Q103 are driven on and off at the same time. Also, this phasing causes transistors Q101 and Q104 to be driven on while transistors Q102 and Q103 are being driven off (and vice-versa). When transistor Q101 is driven on, it acts as an effective short, and the positive direct current (DC) power supply rail voltage ($V_{out+}$) is then applied to pin 3 of one of the two windings of transformer T1. Simultaneously, transistor Q104 will also be driven on, acting as an electrical short, and this allows the negative DC power supply rail voltage ($V_{out-}$) to be applied to pin 4 of the other winding of transformer T1.

Figure 5:
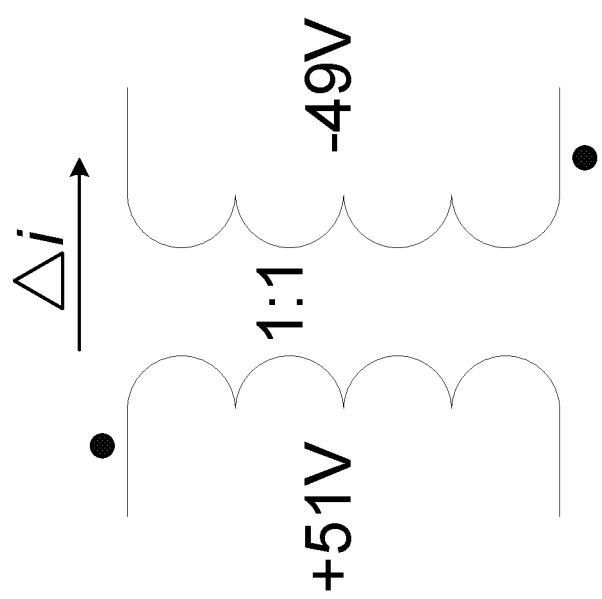
FIG. 5 illustrates an example of voltages applied to the windings of the voltage matching transformer of FIG. 1 according to aspects of the embodiments.

According to aspects of the embodiments, the two windings of T1 have the exact same number of turns and are wound about the same core, therefore, any voltage applied across one of the two windings will produce an equal voltage across the other winding. As those of skill in the art can appreciate, this means that the conventional indication of primary and secondary are without meaning in regard to transformer T1, as there is no input-output, but instead there is a reciprocal, substantially unitary relationship between one side and the other side of the transformer T1. According to aspects of the embodiments, however, if the voltages applied across the two windings are unequal, current will be forced to flow through the MOSFETs and the windings of T1 in a direction so as to substantially equalize the voltages applied across the two windings. FIG. 5 illustrates an example of such a condition, described in greater detail below.

According to further aspects of the embodiments, the phasing of turning-on the first and second pair of transistors, Q101 and Q104, and Q102 and Q103 (as briefly described above), the first pair of transistors is turned on during a first half cycle of the voltage swing across T1, and the second pair of transistors is turned on during a second half cycle of the voltage swing across T1, meaning that when the first pair is on, the second pair are off, and when the first pair are off, the second pair are on), means that the first and second pair of transistors provide a power supply balancing function when there is either or both of an over-voltage/under-voltage condition on the positive voltage supply (Vout+) and an over-voltage/under-voltage condition on the negative voltage supply (Vout−) (e.g., in a +/−50 VDC power supply, Vout+=51 VDC and Vout−=−49 VDC).

If, for example, there was an under-voltage situation on the negative power supply, Vout−=−49 VDC, when Q101 and Q104 turn on, current will flow from the positive rail, Vout+, and into the negative rail through Q102 and Q103 (which will be turned on in the next half-cycle), to correct the imbalance. In the negative rail under-voltage case, the higher voltage is applied across the T1-3/1 pins of transformer T1 while the lower voltage is applied across the T1-6/4 pins, and in the second case the higher voltage gets applied across the T1-6/4 pins and the lower voltage is applied across the T1-3/1 pins, of transformer T1. According to aspects of the embodiments, this symmetrical action and alternating 50% duty cycle maintains the volt-seconds balancing on the windings of transformer T1. As those of skill in the art can appreciate, when the positive and negative power supplies are unbalanced, the current builds up in the magnetizing inductance of the transformer. If the unbalanced situation is not quickly corrected, then the core of the transformer will saturate, causing non-linear operation.

By way of non-limiting example, suppose that $V_{out+}$ is +51 volts direct current (VDC), and $V_{out-}$ is −49 VDC (from hereon in, the "VDC" will simply be referred to as "V"). When transistors Q101 and Q104 are both driven to the "on" condition (i.e., essentially an electrical short across the drain and source; note that in RBC 100, all of transistors Q101-Q104 are n-channel MOSFETs, though this need not necessarily be the case), 51V will be applied across one of the windings of T1 (pins 3 to pin 1), and −49V will be applied across the other winding of T1 (pin 6 to pin 4). Since the magnitude of these voltages is different, current will flow in a direction so as to equalize the difference. Specifically, for this example, current will flow from $V_{out+}$ through transistor Q101, into pin 3 of T1, and current will flow from $V_{out-}$ through transistor Q104 into pin 4 of T1. Because the two windings on T1 are exactly the same, these current directions will have the effect of decreasing the voltage at $V_{out+}$ and increasing the voltage at Vout− to a larger negative value. That is, as 51 volts is impressed across a first set of windings, the second set will experience the same 51 volts; however, because only 49 volts is impressed on the second set because transistor Q104 is turned on and Vout− is −49 volts, current will flow from Vout+, forcing it to decrease in voltage, while current will flow into Vout−, forcing it to increase in voltage, until the both are equal.

Referring now to FIG. 5, the over- and under-voltage situation just described above can be seen in reference to transformer T1. On a first side, across pins 3 and 1, there is applied +51V, and across pins 4 and 6, −49V. The winding ratio of transformer T1, as described above, is substantially close to 1, so there would be attempt to drive an equal but opposite voltage across the transformer windings; this causes a net current flow from the over-voltage positive side of transformer T1 (bring it less positive) to the under-voltage negative side of transformer T1 in order to bring it more negative, until the two are balanced.

In a substantially similar manner, according to further aspects of the embodiments, when Q102 and Q103 are driven on (and Q101 and Q104 are driven off), $V_{out+}$ and $V_{out-}$ will again be applied across the two windings of T1, but in an opposite manner. That is, $V_{out+}$ will now be applied across T1 pins 4 and 6, and $V_{out-}$ will now be applied across T1 pins 1 and 3. According to aspects of the embodiments, this design feature of RBC 100—to switch the polarities of the voltages applied to the separate windings of transformer T1 depending on which transistor pairs (Q101 and Q104, versus, Q102 and Q103)—prevents T1 from saturating. By alternating the voltage and polarity of the signal applied across the two windings of T1 at the fixed 50% duty cycle, each of the two windings is driven with exactly the same voltage-time product as the other winding. When the voltage-time product of the two windings are equal, and have an average value of zero over time, the magnetizing current in the transformer will not build up, and the transformer will not saturate. While those of skill in the art can appreciate that saturation will not occur when the average voltage-time product is zero and the magnetizing current will therefore not build-up, it is the manner of how it is achieved in RBC 100 according to aspects of the embodiments that is novel and un-obvious as described above.

According to still further aspects of the embodiments, the current that flows through each of the two windings of T1 also flows through corresponding current sensing resistors, R101 and R102. As those of skill in the art can appreciate, such current sensing resistors are typically very low ohms (usually substantially less than or about 1 ohm), and high power rating resistors (several watts, or more), and with power ratings of about 1-2 W. The former prevents a substantial voltage drop across the resistor, while the latter handles the higher power that will be dissipated through the resistor. The voltage developed across each resistor R101 and R102 can be sensed by high-speed voltage comparator circuit (HSVCC) 300, shown in FIG. 3, to affect an overcurrent protection feature for aspects of the embodiments. According to aspects of the embodiments, R101 and R102 are shown, by way of non-limiting example only, to be about 0.02 ohms each.

Figure 2:
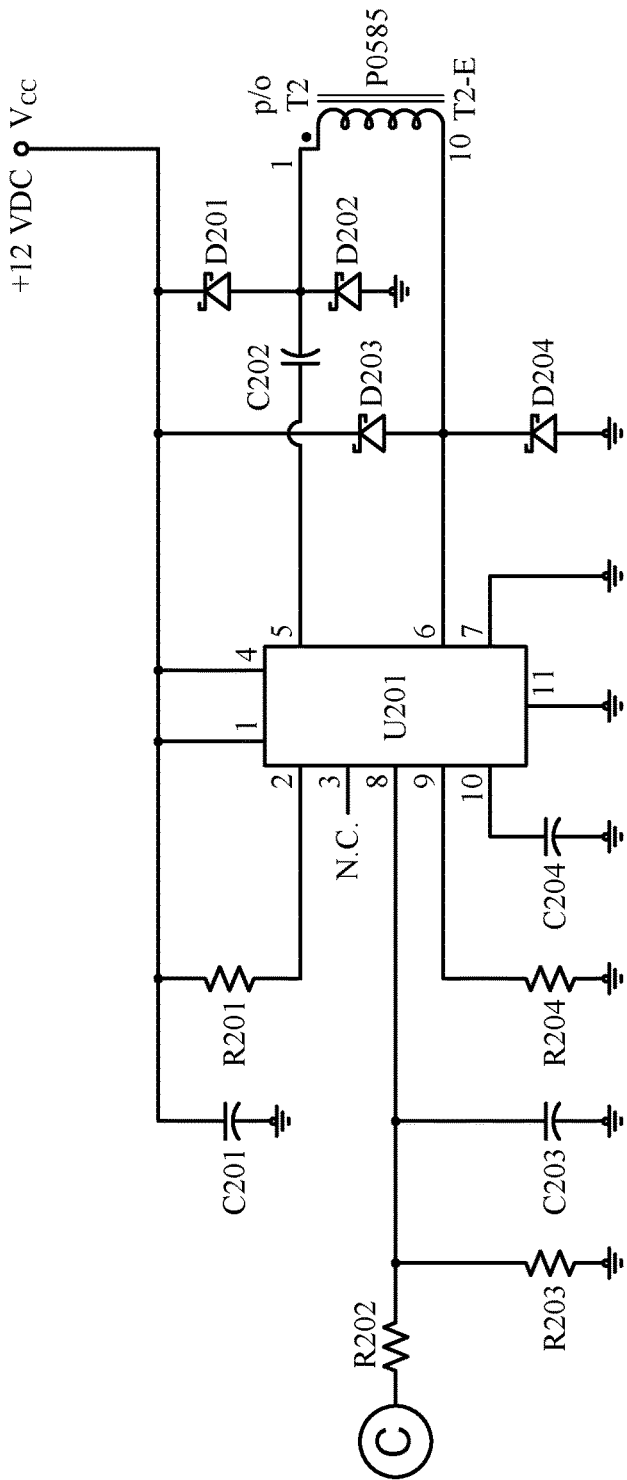
FIG. 2 illustrates a schematic of a control circuit used in the rail balancing circuit of FIG. 1.

Referring now to FIG. 2, shown therein is a schematic for drive signal circuit (DSC) 200 according to further aspects of the embodiments. DSC 200 is adapted to drive the gate-drive transformer T2 with a substantially precise and fixed 50% duty cycle drive signal. The particular commercial integrated circuit chosen, a Texas Instruments LM5033 voltage mode controller, also referred to as U201, incorporates high current drive transistors for the purpose of transformer gate-drive functions. It has two push-pull outputs at pins 5 and 6, which connect to the primary inputs of T2 (pins 1 and 10) through AC coupling capacitor C202. It also includes an internal oscillator with duty-cycle substantially fixed at about 50%, as well as a high-speed shutdown terminal (pin 8). The shutdown feature of DSC 200 is described in greater detail in regard to FIG. 3. According to aspects of the embodiments, DSC 200 is substantially continuously operated in order to provide substantially continuous checking of the rail voltages, and to substantially immediately correct over- and under-voltages as they occur.

Figure 3:
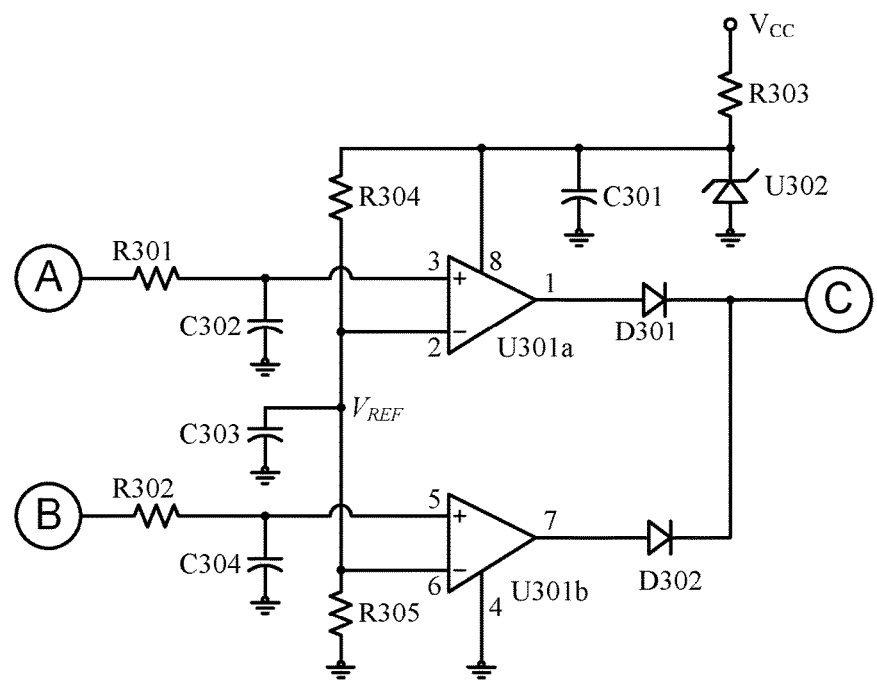
FIG. 3 illustrates a schematic of a high-speed voltage comparator circuit used in conjunction with the rail balancing circuit of FIG. 1 according to aspects of the embodiments.

Referring now to FIG. 3, there is shown high-speed voltage comparator circuit (HSVCC) 300. Circuit nodes A and B of HSVCC 300 connect to the current sensing resistors R101, R102, of FIG. 1, also denoted as circuit nodes A and B. As high current flows through one or both of these current sensing resistors, a voltage is developed at nodes A and/or B. This voltage is then applied to input pins 3 and 5 (respectively) of integrated circuits U301a,b (both of which are high speed voltage comparator integrated circuits, e.g., ST Microelectronics TS3022 Dual Micro Power FAST Comparator), through resistors R301, R302, respectively. The voltage at these pins is compared to $V_{REF}$. The reference voltage $V_{REF}$ is developed by the circuit elements of R305, U302, and R304. $V_{REF}$ is generally determined by the following formula:

$$V_{Ref} = \frac{V_{ZD} \times R_{305}}{R_{304} + R_{305}}, \qquad (1)$$

where $V_{ZD}$ is the voltage formed across U302, which is a zener diode.

If the voltage at pin 3 exceeds the voltage at pin 2, the output of comparator U301a will go to a voltage that represents a logic level of "high" or "one." As those of skill in the art can appreciate, a "high" voltage in terms of comparator circuits and the like is defined as a logic level "one" as compared to "low" or a logic level "zero"; the actual voltage value of a logic "high" versus "low" can vary dependent on many different variables, but for the purposes of this discussion, the voltage level of a logic "high" or "one" can be about 3.5V, or higher, and the voltage level of a logic "low" or "zero" is anything below about 0.5V; these values are not to be taken in a limiting manner (as being but one example only). Likewise, when the voltage at pin 5 exceeds the voltage at pin 6, the output of comparator U301b will go high. The output of U301a is input into the anode side of diode D301 and the output of U301b is input into the anode side of diode D302, and the two cathodes of these diodes are tied together, forming a logic "OR" function of the two outputs of U301a and U301b. In the configuration shown and described in regard to FIG. 3, if either comparator output pin goes high, a high voltage level will become present at circuit node C.

According to an aspect of the embodiments, the selection of the values of the voltage divider resistors R304, R305 sets Vref to 200 mV. This establishes a trip current of about 10 A through each of the 0.02 ohm current sensing resistors R101 and R102, because 10 A×0.02Ω=200 milli-volts (mVs). The selection of the trip current level is determined by knowing how much current will need to be "steered" between the two rails to maintain balance. This is a function of the output power capability of the amplifier. An amplifier with a higher output power capability will draw more unbalanced current from the rails, and will require the balancer to steer a higher current level to maintain balance. The selection of the MOSFETS, as well as the wire gauge in the transformer, and the resistance and the power rating of R101 and R102, should be made in regard to handling these current levels. Those of skill in the art can appreciate these practical circuit design considerations, and can further appreciate that different requirements will cause different values than those listed herein, and thus those values included are not to be taken in a limiting manner.

Node C of HSVCC 300 is connected to shutdown pin 8 of U201 (through resistor R202) of DSC 200. When a logic level one or high signal is applied to shutdown pin 8 of U201 of DSC 200, a very fast shutdown of the outputs of U201 occurs, and consequently any of transistors Q101 through Q104 that may have been on, will be quickly driven off, stopping the flow of current through the windings of transformer T1 and the two sense resistors, R101 and R102. The purpose of HSVCC 300 and it's interaction with DSC 200 is to provide overcurrent protection. The overcurrent protection circuitry acts to protect the power MOSFETs (Q101 through Q104) from damage due to overcurrent conditions that can arise for a variety of fault conditions. Overcurrent will not occur when the application circuit is operated within the nominal design limits targeted for the application. According to aspects of the embodiments, the rise time of overcurrent conditions is in the order of about a microsecond (≈1 μsec). Therefore, comparators with response times of about 200 nano-seconds are more than fast enough to respond to overcurrent conditions.

Figure 6:
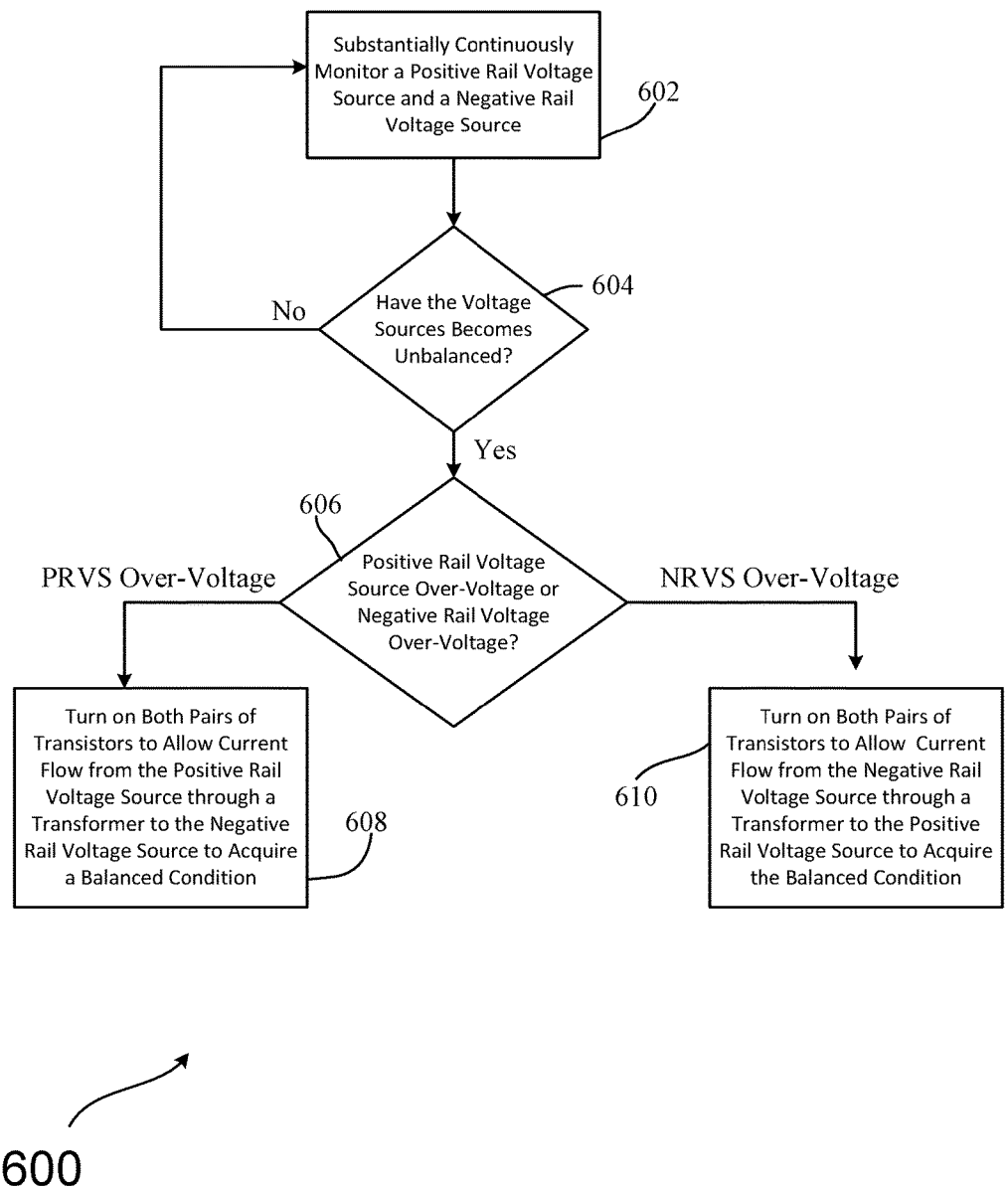
FIG. 6 illustrates a flowchart of a method for operating the rail balancing circuits of FIGS. 1-3 according to aspects of the embodiments.

FIG. 6 illustrates a flowchart of method 600 for operating RBC 100 according to aspects of the embodiments. As those of skill in the art can appreciate, the steps of method 600, which pertains to the operations of RBC 100 and the other circuits of FIGS. 2 and 3, are representative of actions taken and performed by those circuits, and as such are not true "steps" as in a computer program or routine, but are steps in the sense as circuit conditions that occur as a result of other circuits conditions.

Method 600 begins with step 602 in which RBC 100 substantially continuously monitors both a positive rail voltage source and a negative rail voltage source for an unbalanced condition. In decision step 604, RBC 100 determines whether the voltage sources have become unbalanced. If the sources are not unbalanced ("No" path from decision step 604), method 600 returns to method step 602, and substantially continuously monitors the positive and negative rail supply voltages.

If the sources are unbalanced, however ("Yes" path from decision step 604), method 600 proceeds to decision step 606 in which method 600 seeks to determine whether the positive rail voltage source is in an over-voltage condition and the negative rail voltage source is in an under-voltage condition, or is the positive rail voltage source in an under-voltage condition and the negative rail voltage source is in an over-voltage condition. If the power supply voltage sources are in the former condition, method 600 proceeds to step 608, in which both pairs of transistors are alternatively turned on to allow current flow from the positive rail voltage source through transformer T1 to the negative rail voltage source, so that a balanced condition can be substantially instantaneously acquired.

If, however, the power supply voltage sources are in the latter condition, method 600 proceeds to step 610, in which again both pairs of transistors are alternatively turned on to allow current flow from the negative rail voltage source through transformer T1 to the positive rail voltage source, so that a balanced condition can be substantially instantaneously acquired.

The disclosed embodiments provide systems, methods, and modes for mitigating over-voltage situations in Class-D amplifiers. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for mitigating over-voltage situations in Class-D amplifiers.

Alternate Embodiments

Alternate embodiments may be devised without departing from the spirit or the scope of the different aspects of the embodiments.

I claim:

1. A rail balancing circuit (RBC) for use with a power supply, the RBC comprising:
a circuit adapted to respond to over-voltage and under-voltage conditions in the power supply that comprises a positive rail voltage source and a negative rail voltage source, such that any deviation from a balanced condition between the positive rail voltage source and the negative rail voltage source is substantially instantaneously corrected to bring both the positive and negative rail voltage sources back to the balanced condition;
a first pair of transistors adapted to balance the positive and negative rail voltage sources when an over-voltage condition exists on the positive rail voltage source and an under-voltage condition occurs on the negative rail voltage source;
a second pair of transistors adapted to balance the positive and negative rail voltage sources when an over-voltage condition exists on the negative rail voltage source and an under-voltage condition occurs on the positive rail voltage source;
a timing circuit adapted to alternatively turn on and off the first and second pair of transistors, such that when the first pair of transistors is on, the second pair of transistors is off, and when the second pair of transistors is on, the first pair of transistors is off; and
an over-current circuit adapted to turn off both the first pair and second pair of transistors when an over-current condition exists through the first transformer.

2. The RBC according to claim 1, wherein
the circuit is further adapted to respond, when in a first circuit state condition, to apply a positive rail voltage to a first input of a first transformer and a negative rail voltage to a second input of the first transformer.

3. The RBC according to claim 2, further comprising:
a first transistor based circuit arrangement adapted to operate as a first power supply voltage balancer for both the positive and negative rail voltage sources when the positive rail voltage source is in either an over-voltage or under-voltage condition and the negative rail voltage source is in either an under-voltage or over-voltage condition.

4. The RBC according to claim 3, wherein the first circuit state condition comprises:
the first transistor based circuit arrangement is in an on condition such that first transistor based circuit arrangement is substantially electrically equivalent to an electrical short, so that current can flow through the first transistor based circuit arrangement in a substantially unimpeded manner with substantially no voltage drop across the first transistor based circuit arrangement.

5. The RBC according to claim 3, wherein
the circuit, when in the first circuit state condition, and experiencing a positive rail voltage over-voltage situation, allows the positive rail voltage source to supply additional current to the negative rail voltage source through the first transistor based circuit arrangement and the first transformer such that a balanced condition is substantially instantaneously achieved.

6. The RBC according to claim 3, wherein first circuit state condition further comprises:

a second transistor based circuit arrangement in an off condition such that each of the transistors is substantially electrically equivalent to an electrical open, so that current cannot flow through either of them.

7. The RBC according to claim 3, wherein the first transistor based circuit arrangement comprises:
a first n-channel transistor (first transistor), a drain connection of which is connected to the positive rail voltage source, a source connection of which is connected to the first input of the first transformer, and a gate connection of which is connected to a switching on-off drive signal (switching drive signal), the switching drive signal turning the first transistor periodically on and off; and
a second n-channel transistor (second transistor), a source connection of which is connected to the negative rail voltage source, a drain connection of which is connected to the second input of the first transformer, and a gate connection of which is connected to the switching drive signal to be periodically turned on and off substantially simultaneously with the first transistor.

8. The RBC according to claim 1, wherein
the circuit is further adapted to respond, when in a second circuit state condition, to apply the positive rail voltage to the second input of the first transformer and the negative rail voltage to the first input of the first transformer.

9. The RBC according to claim 8, further comprising:
a second transistor based circuit arrangement adapted to operate as a second power supply voltage balancer for both the positive and negative rail voltage sources when the positive rail voltage source is in either an under-voltage or over-voltage condition and the negative rail voltage source is in either an under-voltage or over-voltage condition.

10. The RBC according to claim 9, wherein the second circuit state condition comprises:
the second transistor based circuit arrangement is in an on condition such that the second transistor based circuit arrangement is substantially electrically equivalent to an electrical short, so that current can flow through the second transistor based circuit arrangement in a substantially unimpeded manner with substantially no voltage drop across the second transistor based circuit arrangement.

11. The RBC according to claim 9, wherein
the circuit, when in the second circuit state condition, and experiencing a negative rail voltage over-voltage situation, allows the negative rail voltage source to supply additional current to the positive rail voltage source through the second transistor based circuit arrangement and the first transformer such that a balanced condition is substantially instantaneously achieved.

12. The RBC according to claim 9, wherein second circuit state condition further comprises:
a second transistor based circuit arrangement in an off condition such that the second transistor based circuit arrangement is substantially electrically equivalent to an electrical open, so that current cannot flow through the second transistor based circuit arrangement.

13. The RBC according to claim 9, wherein the second transistor based circuit arrangement comprises:
a third n-channel transistor (third transistor), a source connection of which is connected to the negative rail voltage source, a drain connection of which is connected to the first input of the first transformer, and a gate connection of which is connected to a switching on-off drive signal (switching drive signal), the switching drive signal turning the third transistor periodically on and off; and
a fourth n-channel transistor (fourth transistor), a drain connection of which is connected to the positive rail voltage source, a source connection of which is connected to the second input of the first transformer, and a gate connection of which is connected to the switching drive signal to be periodically turned on and off substantially simultaneously with the third transistor.

14. A method for operating a rail balancing circuit (RBC) for use in maintaining a balanced condition in a power supply with equal but opposite polarity outputs, the method comprising:
substantially continuously switching a positive rail voltage source and a negative rail voltage source; and
when the positive rail voltage source has experienced an over-voltage condition and the negative rail voltage source has experienced an under-voltage condition, turning on a first pair of transistors adapted to balance the positive and negative rail voltage sources when the over-voltage condition exists on the positive rail voltage source and the under-voltage condition occurs on the negative rail voltage source, and
when the negative rail voltage source has experienced an over-voltage condition and the positive rail voltage source has experienced an under-voltage condition, turning on a second pair of transistors adapted to balance the positive and negative rail voltage sources when the over-voltage condition exists on the negative rail voltage source and the under-voltage condition occurs on the positive rail voltage source.

15. The method according to claim 14, wherein the step of turning on a first pair of transistors comprises:
applying a positive rail voltage to a first input of a first transformer and a negative rail voltage to a second input of the first transformer.

16. The method according to claim 14, wherein the step of turning on a first pair of transistors comprises:
operating the first pair of transistors as a first power supply voltage balancer for both the positive and negative rail voltage sources when the positive rail voltage source is in the over-voltage condition and the negative rail voltage source is in the under-voltage condition.

17. The method according to claim 16, wherein
the first pair of transistors are in an on condition such that each of the transistors is substantially electrically equivalent to an electrical short, so that current can flow through each of them in a substantially unimpeded manner with substantially no voltage drop across the transistor.

18. The method according to claim 17, further comprising:
the positive rail voltage source supplying additional current to the negative rail voltage source through the first and second transistors and the first transformer such that a balanced condition is substantially instantaneously achieved.

19. The method according to claim 16, further comprising:
a second pair of transistors being in an off condition such that each of the transistors is substantially electrically equivalent to an electrical open, so that current cannot flow through either of them.

20. The method according to claim 14, wherein the step of turning on the second pair of transistors comprises:

applying the positive rail voltage to the second input of the first transformer and the negative rail voltage to the first input of the first transformer.

21. The method according to claim 14, wherein the step of turning on the second pair of transistors comprises:
operating the second pair of transistors as a second power supply voltage balancer for both the positive and negative rail voltage sources when the positive rail voltage source is in the under-voltage condition and the negative rail voltage source is in the over-voltage condition.

22. The method according to claim 21, wherein
the second pair of transistors are in an on condition such that each of the transistors is substantially electrically equivalent to an electrical short, so that current can flow through each of them in a substantially unimpeded manner with substantially no voltage drop across the transistor.

23. The method according to claim 22, further comprising:
the negative rail voltage source supplying additional current to the positive rail voltage source through the third and fourth transistors and the first transformer such that a balanced condition is substantially instantaneously achieved.

24. The method according to claim 21, further comprising:
a first pair of transistors being in an off condition such that each of the transistors is substantially electrically equivalent to an electrical open, so that current cannot flow through either of them.

* * * * *